United States Patent
Jeong et al.

(10) Patent No.: US 6,944,089 B2
(45) Date of Patent: Sep. 13, 2005

(54) SYNCHRONOUS SEMICONDUCTOR DEVICE HAVING CONSTANT DATA OUTPUT TIME REGARDLESS OF BIT ORGANIZATION, AND METHOD OF ADJUSTING DATA OUTPUT TIME

(75) Inventors: Byung-Hoon Jeong, Kyungki-do (KR); Woo-Seop Jeong, Kyungki-do (KR); Byung-Chul Kim, Kyungki-do (KR); Beob-Rae Cho, Kyungki-do (KR); Seung-Bum Ko, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 255 days.

(21) Appl. No.: 10/334,776

(22) Filed: Dec. 31, 2002

(65) Prior Publication Data

US 2003/0210604 A1 Nov. 13, 2003

(30) Foreign Application Priority Data

May 9, 2002 (KR) ........................................ 2002-25627

(51) Int. Cl.$^7$ .............................. G11C 8/00; G11C 7/00
(52) U.S. Cl. ................... 365/233; 365/189.07; 365/194
(58) Field of Search ........................... 365/233, 189.07, 365/194

(56) References Cited

U.S. PATENT DOCUMENTS

| 6,426,900 B1 | * | 7/2002 | Maruyama et al. | .......... 365/194 |
| 6,707,758 B2 | * | 3/2004 | Kono | .......... 365/233 |
| 6,791,889 B2 | * | 9/2004 | Peterson | .......... 365/233 |

FOREIGN PATENT DOCUMENTS

| KR | 1998-074246 | 11/1998 |
| KR | 1998-078944 | 11/1998 |

* cited by examiner

*Primary Examiner*—Trong Phan
(74) *Attorney, Agent, or Firm*—Marger Johnson & McCollom, P.C.

(57) ABSTRACT

Provided are a synchronous semiconductor device having constant data output time regardless of a bit organization, and a method of adjusting data output time. The synchronous semiconductor device includes an internal clock generator for receiving an external clock and generating an internal clock, a clock controller for adjusting the phase of the internal clock and generating a data output clock in response to bit organization information, and a data output buffer for outputting data read from a memory cell to the outside in response to the data output clock. Thus, it is possible to prevent vertical vibration in a disc loaded in a disc driver regardless of wobble of the disc.

15 Claims, 6 Drawing Sheets

SYNCHRONOUS SEMICONDUCTOR DEVICE HAVING CONSTANT DATA OUTPUT TIME REGARDLESS OF BIT ORGANIZATION, AND METHOD OF ADJUSTING DATA OUTPUT TIME

BACKGROUND OF THE INVENTION

1. Field of the Invention

The present invention relates to a synchronous semiconductor device, and more particularly, to a synchronous dynamic random access memory (DRAM) (hereinafter, 'SCRAM') whose bit organization can be changed.

2. Description of the Related Art

A SCRAM is a DRAM device for inputting or outputting at least one kind of data in synchronization with an external clock. The number of data bits that are input to or output from the SCRAM at once is called data input/output regulation or bit organization. For instance, the bit organization of a SCRAM in which 4-bit data is input or output in parallel is 4 and the bit organization of a SCRAM in which 8-bit data is input or output in parallel is 8. In general, the bit organization of a SCRAM is denoted as "×4", "×8", or "×16", for example.

In general, the bit organization of an SCRAM is not determined during a design process but is determined after the SCRAM is designed and manufactured to operate with various bit organizations. That is, SDRAMs are designed to operate with various bit organizations and then their bit organizations are determined right before they are shipped.

In the case of an SCRAM that operates with various bit organizations, access time, however, varies according to its bit organization. Access time refers to time lost in outputting data from a reference edge of a clock and is indicated as tSAC in a single data rate (SDR) SCRAM and as tAC in a double data rate (DDR) SCRAM. In general, the access time is set to be within a predetermined range.

The reason why access time for a SCRAM depends on the bit organization of the SCRAM is that the larger the bit organization is, a greater number of output drivers is needed to drive the number of pins to which power is applied. For this reason, the smaller the bit organization is, the less the access time is, and the larger the bit organization is, the more the access time is. If the access time changes according to the bit organizations there is a high probability that the access time does not fall within the predetermined range.

Figure 1:
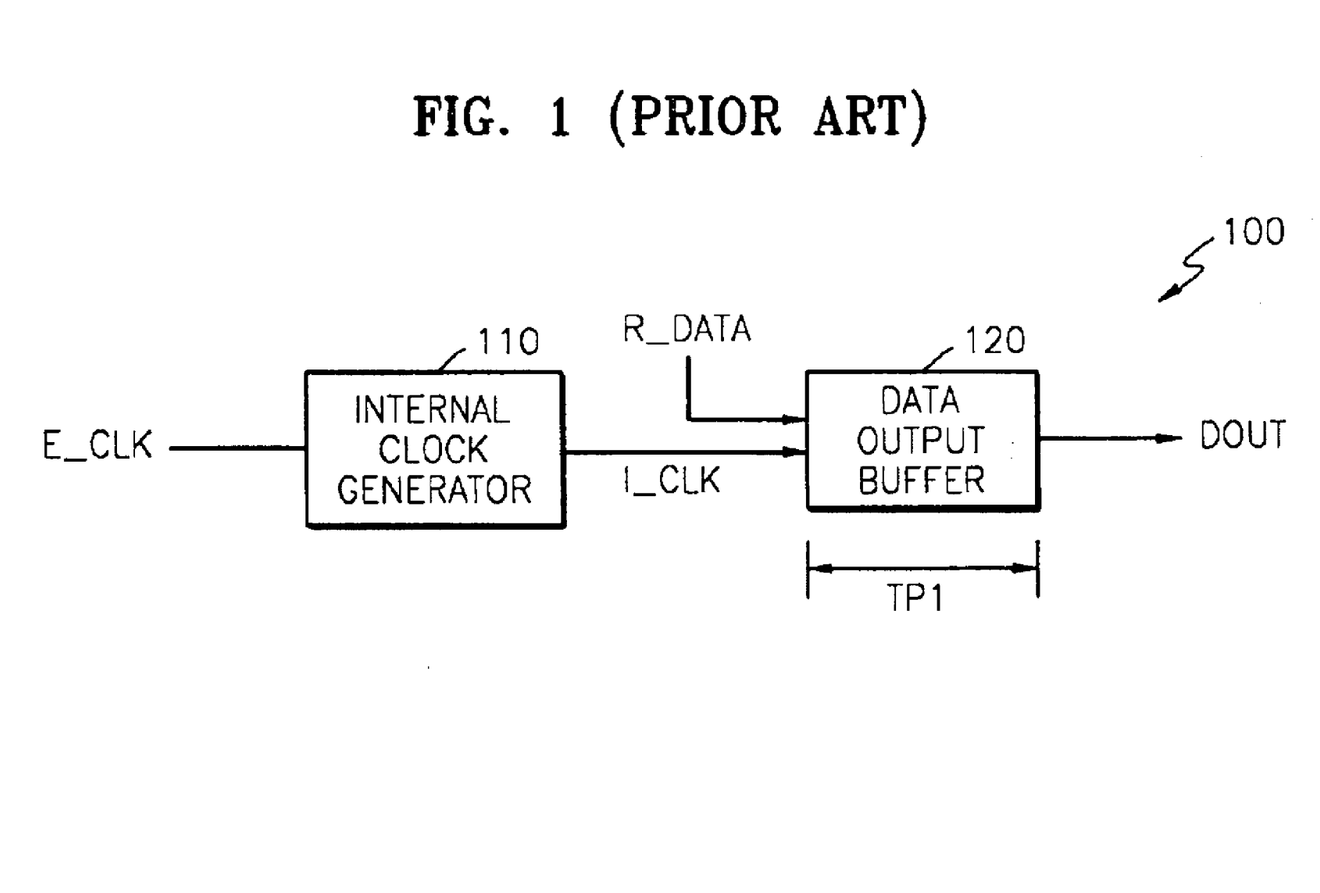
FIG. 1 is a block diagram of a conventional synchronous DRAM.

FIG. 1 is a block diagram of a conventional SCRAM 100. The SCRAM 100 includes an internal clock generator 110 and a data output buffer 120. The internal clock generator 110 receives an external clock E_CLK and generates an internal clock I_CLK. In a single data rate (SDR) SCRAM, the internal clock generator 110 is just a buffer for converting the external clock E_CLK into an internal signal, whereas in a double data rate (DDR) SCRAM, the internal clock generator 110 is a delay-locked loop circuit or phase synchronization loop circuit for precisely controlling the phase of the internal clock I_CLK.

The data output buffer 120 is a circuit that outputs data read from a memory cell to the outside in response to the internal clock I_CLK, and includes an output driver (not shown) that drives an output node (or output pad) to a predetermined level in response to output data R_DATA.

Power consumed by the data output buffer 120 depends on the bit organization of the SCRAM 100. As previously mentioned, the larger the bit organization, the greater the number of operated output drivers (not shown). An increase in the bit organization of the SCRAM 100 results in an increase in access time TP1 in the data output buffer 120. Thus, time lost in outputting data depends on the bit organization.

In conclusion, time for accessing a conventional SCRAM depends on the bit organization, which causes access time for a particular bit organization to deviate from a predetermined range. Also, output data skew increases according to the bit organization.

SUMMARY OF THE INVENTION

To solve the above problem, it is a first object of the present invention to provide a synchronous semiconductor device that operates with various bit organizations but has constant data output time, i.e., access time tAC or tSAC, irrespective of its bit organization, thereby increasing the performance of the synchronous semiconductor device.

It is a second object of the present invention to provide a method of adjusting data output time of such a synchronous semiconductor device.

To achieve one aspect of the first object, there is provided a synchronous semiconductor device including an internal clock generator for receiving an external clock and generating an internal clock, a clock controller for adjusting the phase of the internal clock and generating a data output clock in response to bit organization information, and a data output buffer for outputting data read from a memory cell to the outside in response to the data output clock.

Preferably, the clock controller includes a plurality of paths for generating the data output clock from the internal clock and selects one of the plurality of paths in response to the bit organization information.

To achieve another aspect of the first object, there is provided a synchronous semiconductor device including a delay-locked loop circuit for receiving an external clock and generating a data output clock; and a data output circuit for outputting data read from a memory cell to the outside in response to the data output clock. The delay-locked loop circuit includes a phase comparator for comparing the phase of external clock with the phase of a feedback signal and generating a detection signal corresponding to a difference between their phases; a delay controller for receiving the detection signal and generating a delay control signal; a delayer for delaying the external clock for a predetermined time in response to the delay control signal and generating the data output clock; and a compensation delay controller for delaying the data output clock in response to the bit organization information and generating the feedback signal.

Preferably, the compensation delay controller includes a plurality of paths for generating the feedback signal from the data output clock, and selects one of the plurality of paths in response to the bit organization information.

To achieve one aspect of the second object, there is provided a method of regularly adjusting data output time of a synchronous semiconductor device regardless of bit organization, the method including receiving an external clock and generating an internal clock; adjusting the phase of the internal clock according to the bit organization and generating a data output clock; and outputting data read from a memory cell to the outside in response to the data output clock.

Preferably, generating the data output clock includes selecting one of a plurality of paths that generate the data output clock from the internal clock and have different delay times, in response to the bit organization information.

To achieve another aspect of the second object, there is provided a method of regularly adjusting a synchronous semiconductor device regardless of bit organization, the method including comparing the phase of an external clock with the phase of a feedback signal and generating a detection signal corresponding to a difference between their phases; generating a delay control signal in response to the detection signal; delaying the external clock for a predetermined time in response to the delay control signal and generating a data output clock; adjusting the phase of the data output clock according to the bit organization and generating the feedback signal; and outputting data read from a memory cell to the outside in response to the data output clock.

Preferably, generating the feedback signal includes selecting one of a plurality of paths that generate the feedback signal from the data output clock and have different delay times, in response to the bit organization information.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 2:
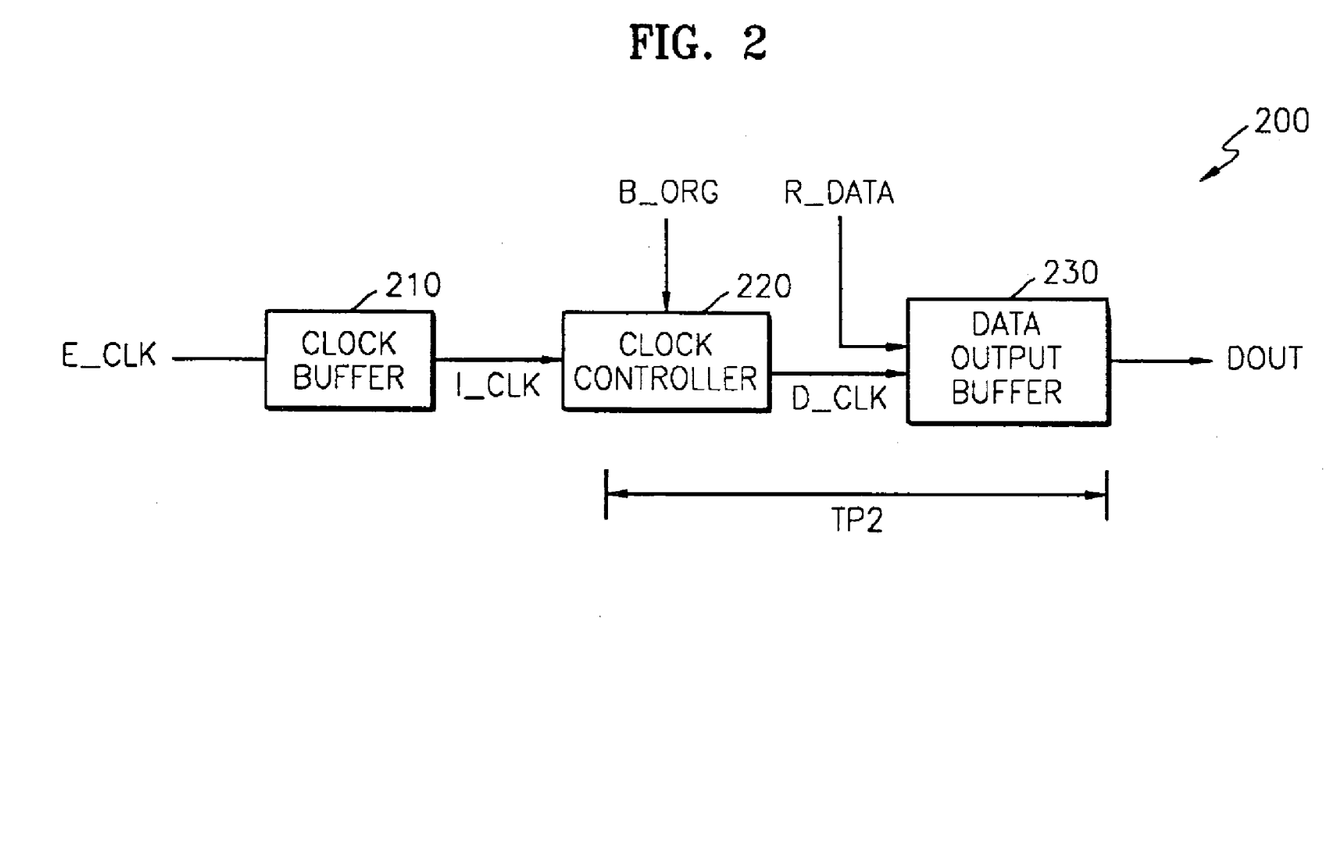
FIG. 2 is a block diagram of a preferred embodiment of a synchronous DRAM according to the present invention.

FIG. 2 is a block diagram of one embodiment of a SCRAM 200 according to the present invention. The SCRAM 200 includes a clock buffer 210, a clock controller 220, and a data output buffer 30.

The clock buffer 210 buffers an external clock E_CLK to generate an internal clock I_CLK. Therefore, the internal clock I_CLK has a phase that lags the phase of the external clock E_CLK by a predetermined amount.

The clock controller 220 receives the internal clock I_CLK, adjusts the phase of the internal clock I_CLK in response to bit organization information B_ORG, and generates the result as a data output clock D_CLK. In other words, the clock controller 220 generates the data output clock D_CLK to be delayed for a predetermined time, from the internal clock I_CLK, or generates the data output clock D_CLK to have substantially the same phase as the internal clock I_CLK according to the bit organization information B_ORG. The bit organization information B_ORG is an internal signal indicating the degree of the set bit organization.

The data output buffer 230 outputs data R_DATA read from a memory cell to the outside in response to the data output clock D_CLK. That is, the data output buffer 230 is triggered by the data output clock D_CLK and then begins outputting of the data R_DATA read from the memory cell.

Time lost in applying the data output clock D_CLK to the data output buffer 230 and then outputting the result depends on the bit organization. That is, the larger the bit organization, the longer a delay time in the data output buffer 230. Therefore, the clock controller 220 is set such that the smaller the bit organization, the longer the delay time. In this way, it is possible to fix a total delay time of TP2 in the clock controller 220 and the data output buffer 230 irrespective of the bit organization. This also makes an access time lost in outputting data in response to the external clock E_CLK constant irrespective of the bit organization.

Figure 3:
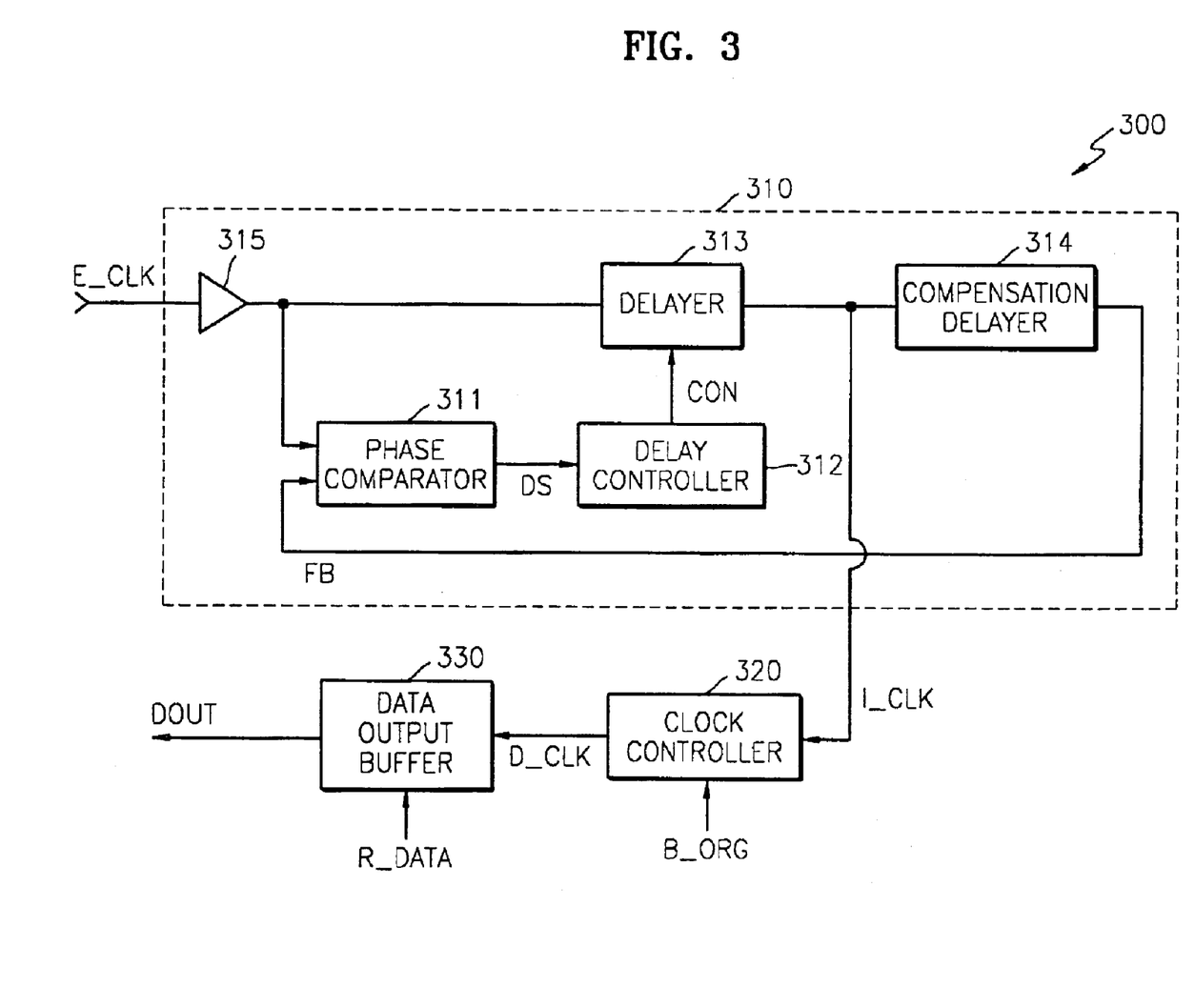
FIG. 3 is a block diagram of another embodiment of a synchronous DRAM according to the present invention.

FIG. 3 is a block diagram of another embodiment of an SCRAM 300 according to the present invention. The SCRAM 300 includes a delay-locked loop circuit 310, an output controller 320, and a data output buffer 330.

The delay-locked loop circuit 310 includes a buffer 315, a phase comparator 311, a delay controller 312, a delayer 313, and a compensation delayer 314. The phase comparator 311 compares the phase of an external clock E_CLK with that of a feedback signal FB and generates a detection signal DS corresponding to a difference between their phases. The delay controller 312 receives the detection signal DS and generates a delay control signal CON. The delayer 313 delays the external clock E_CLK by a predetermined time using the delay control signal CON so as to generate an internal clock I_CLK. The compensation delayer 314 is a replica circuit that compensates for a delay time in the data output buffer 330 and the clock controller 320, and delays the internal clock I_CLK to generate the feedback signal FB.

Thus, the compensation delayer 314 is set to have the same delay time as in the data output buffer 330 and the clock controller 320, which causes the feedback signal FB to have the same phase as output data DOUT output from the data output buffer 330. Therefore, the delay-locked loop circuit 310 compares the feedback signal FB, which has the same phase as the output data DOUT, with an external clock so as to perform locking operations.

Like the clock controller 220 of FIG. 2, the clock controller 320 adjusts the phase of the internal clock I_CLK in response to bit organization information B_ORG so as to generate a data output clock D_CLK. Preferably, a delay time in the clock controller 320 is set such that the total of delay time in the clock controller 320 and in the data output buffer 30 is constant regardless of the bit organization. Therefore, the smaller the bit organization, the greater a delay time in the clock controller 320.

The data output buffer 330 outputs data R_DATA read from a memory cell to the outside in response to the data output clock D_CLK.

Figure 5:
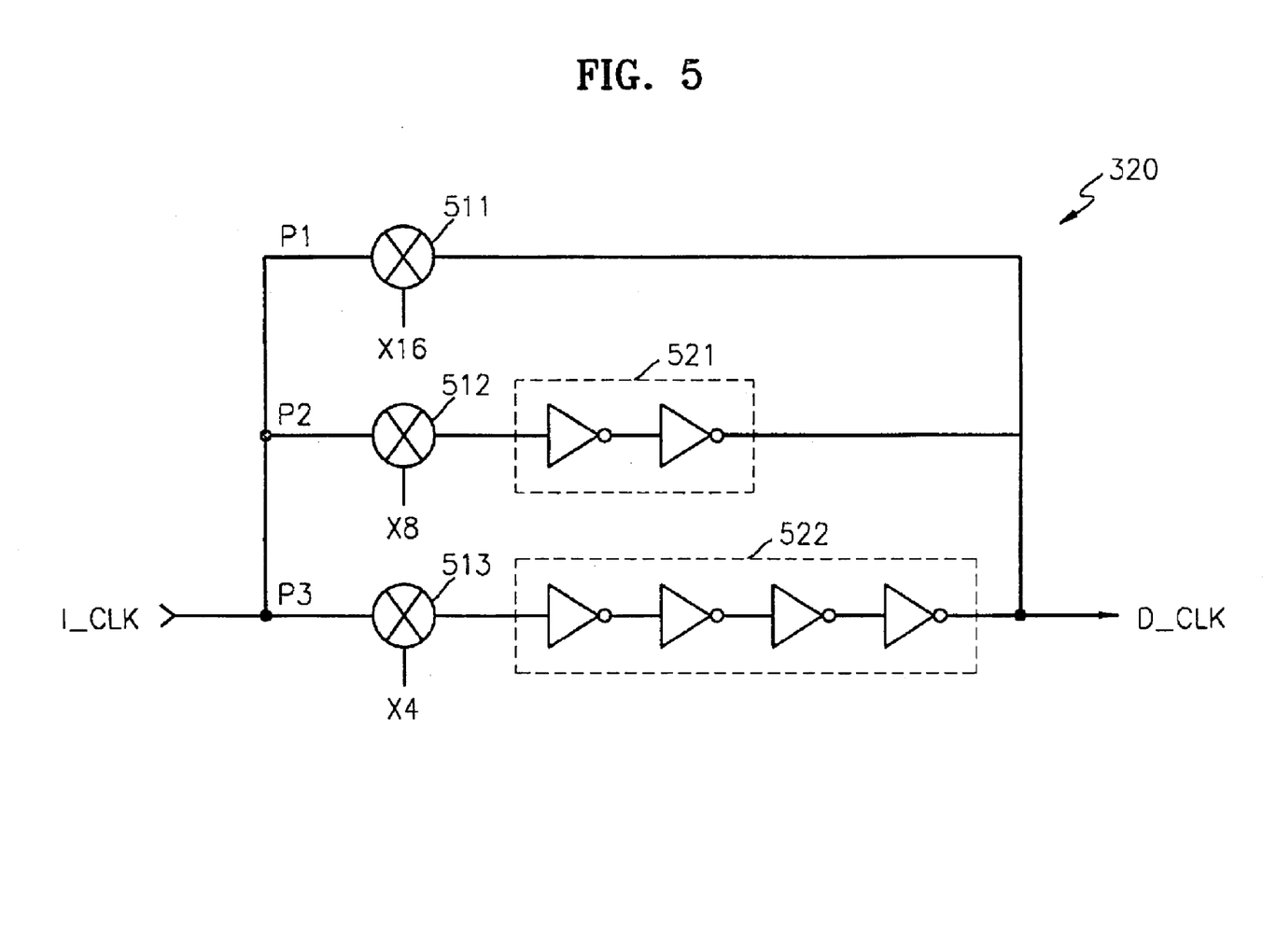
FIG. 5 is a circuit diagram of a clock controller shown in FIG. 3.

The structure of the clock controller 320 is as shown in FIG. 5. Referring to FIG. 5, the clock controller 320 includes a plurality of paths for generating a data output clock D_CLK from an internal clock I_CLK. For convenience, in FIG. 5, the clock controller 320 is illustrated as having three paths, i.e., first through third paths P1, P2, and P3.

The first path P1 includes a switch 511 that is switched on when bit organization information B_ORG is ×16. The second path P2 includes a switch 512 that is switched on when the bit organization information B-ORG is ×8, and a first delayer 521. Preferably, the first delayer 521 has a delay time corresponding to a difference between a delay time in the data output buffer 330 when the bit organization is ×16 and a delay time in the data output buffer 330 when the bit organization is ×8. The third path P3 includes a switch 513 that is switched on when the bit organization is ×4, and a second delayer 522. Preferably, the second delayer 522 has a delay time corresponding to a difference between a delay time in the data output buffer 330 when the bit organization is ×16 and a delay time in the data output buffer 330 when the bit organization is ×4. Each of the first and second delayers 512 and 522 is formed of at least one inverter and a delay time therein is adjusted by the number of inverters.

The clock controller 320 selects one of the first through third paths P1, P2, and P3 in response to the bit organization information B-ORG. More specifically, the first path P1, the second path P2, and the third path P3 are selected when the bit organization is ×16, ×8, and ×4, respectively.

A delay time in the data output buffer 330 that changes according to the bit organization is compensated for by the clock control unit 320. Thus, time lost in outputting data in response to the external clock E_CLK is the same regardless of whether the SCRAM 300 operates with a bit organization of ×4, ×8, or ×16.

It is possible that the clock controller 220 shown in FIG. 2 is set to have the same structure as the clock controller 320 shown in FIG. 5.

Figure 4:
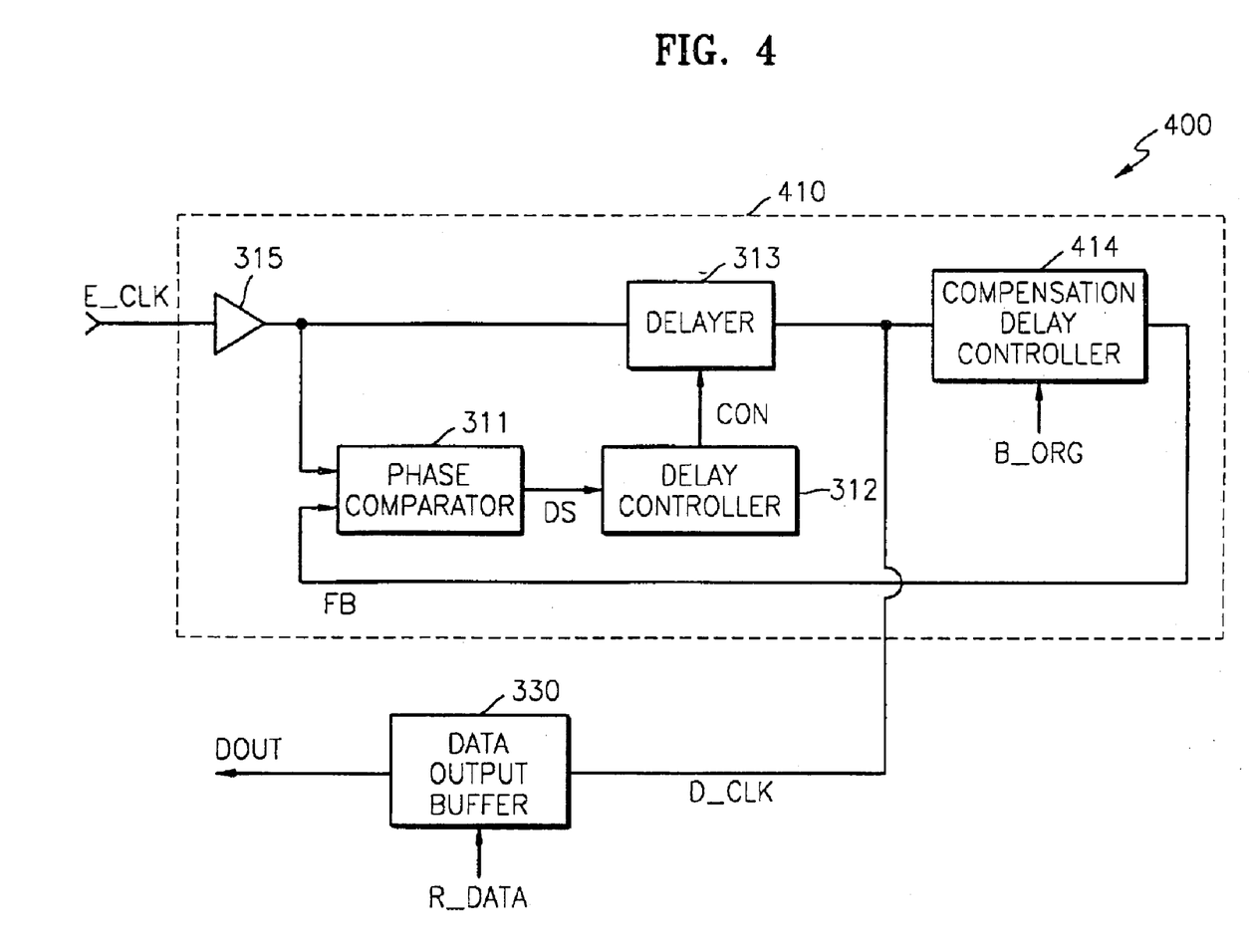
FIG. 4 is a block diagram of still another embodiment of a synchronous DRAM according to the present invention.

FIG. 4 is a block diagram of still another embodiment of an SCRAM 400 according to the present invention. The SCRAM 400 includes a delay-locked loop circuit 410 and a data output buffer 330.

The delay-locked loop circuit 410 includes a buffer 315, a phase comparator 311, a delay controller 312, a delayer 313, and a compensation delay controller 414. In this embodiment, the phase comparator 311, the delay controller 312, the delayer 313, and the data output buffer 330 have the same structures and functions as described with reference to FIG. 3, and thus, their descriptions are omitted here. However, the delayer 313 of FIG. 4 is different from the delayer 313 of FIG. 3 in that it delays an external clock E_CLK in response to a delay control signal CON by a predetermined time so as to generate a data output clock D_CLK.

The compensation delay controller 414 delays the data output clock D_CLK to generate a feedback signal FB. A delay time in the data output clock D_CLK is adjusted in response to bit organization information B-ORG. Therefore, the phase of the feedback signal FB depends on the bit organization.

Figure 6:
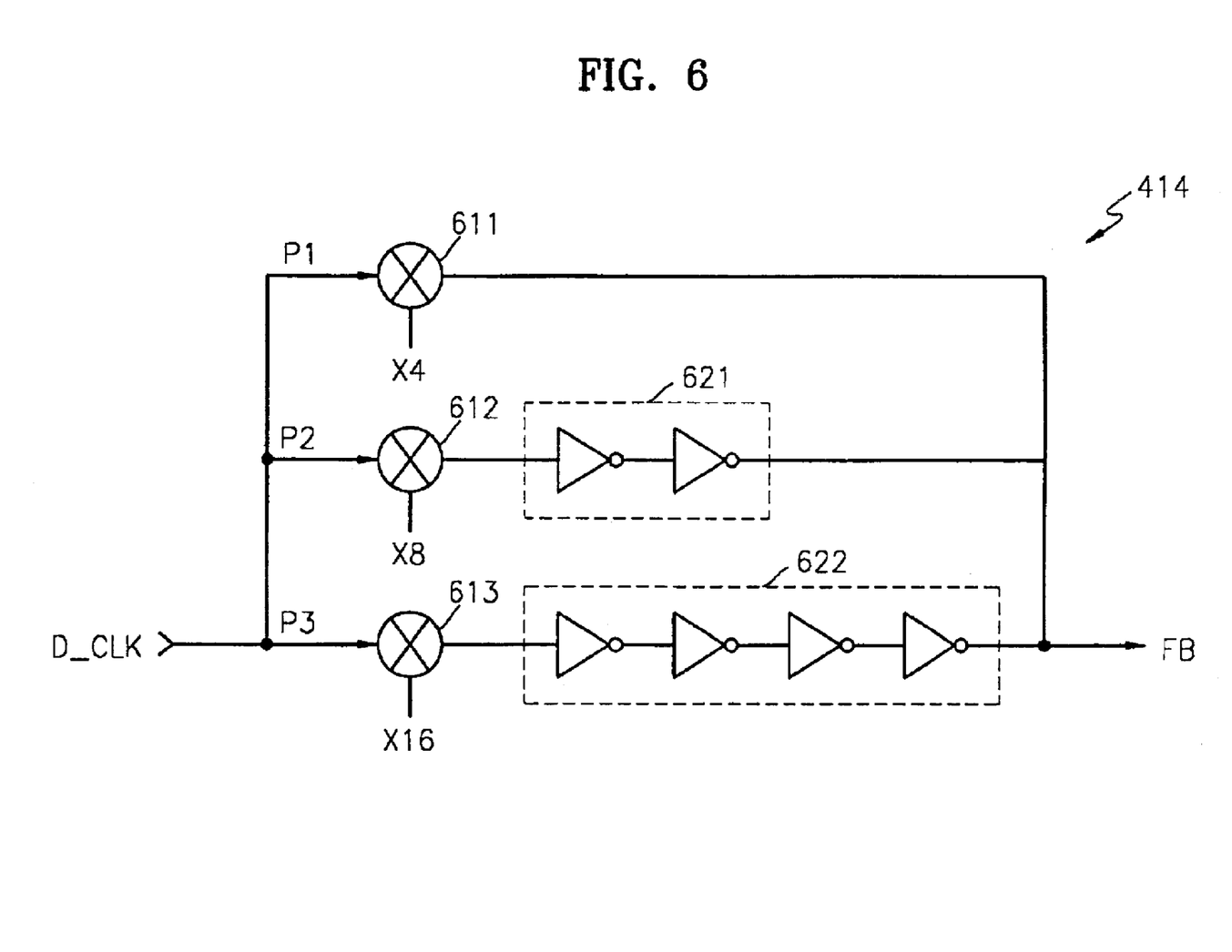
FIG. 6 is a circuit diagram of a compensation delay controller shown in FIG. 4.

The structure of the compensation delay controller 414 is as shown in FIG. 6. Referring to FIG. 6, the compensation delay controller 414 includes a plurality of paths for generating a feedback signal FB from the data output clock D_CLK, but is illustrated as having three paths, i.e., first through third paths P1, P2, and P3, for convenience.

The first path P1 includes a switch 611 that is switched on when bit organization information B_ORG is ×4. The second path P2 includes a switch 612 that is switched on when the bit organization information B-ORG is ×8, and a first delayer 621. Preferably, the first delayer 621 has a delay time that is the same as a delay time in the data output buffer 330 when the bit organization is ×8. The third path P3 includes a switch 613 that is switched on when the bit organization is ×16, and a second delayer 622. Preferably, the second delayer 622 has a delay time that is the same as a delay time in the data output buffer 330 when the bit organization is ×16. Each of the first and second delayers 612 and 622 is formed of at least one inverter and a delay time therein is adjusted by the number of inverters.

The compensation delay controller 414 selects one of the first through third paths P1, P2, and P3 in response to the bit organization information B_ORG. More specifically, the first path P1 is selected when the bit organization is ×4, the second path P2 is selected when the bit organization is ×8, and the third path P3 is selected when the bit organization is ×16.

As described above, a delay time in the compensation delay controller 414 is adjusted according to the bit organization, which causes adjustment of a delay time in the delayer 313. As a result, the data output clock D_CLK having a controlled phase is generated. That is, the shorter a delay time in the compensation delay controller 414, the more closely the data output clock D_CLK approximates the phase of the external clock E_CLK. On the contrary, the longer a delay time in the compensation delay controller 414 is, the more the data output clock D_CLK leads the external clock E_CLK.

In conclusion, a delay time in the data output buffer 330, which changes according to the bit organization, is compensated for by the compensation delay controller 414. Therefore, data output time can be regularly controlled regardless of the bit organization, compared to the external clock E_CLK.

While this invention has been particularly shown and described with reference to preferred embodiments thereof, it will be understood by those skilled in the art that various changes in form and details may be made therein without departing from the spirit and scope of the invention as defined by the appended claims.

According to the present invention, time lost in outputting data by a synchronous semiconductor device that operates with various bit organizations can be regular, thereby minimizing skew of output data according to the bit organization.

What is claimed is:

1. A synchronous semiconductor device comprising:
    an internal clock generator to receive an external clock and generate an internal clock;
    a clock controller to receive the internal clock and bit organization information and to adjust the phase of the internal clock and generate a data output clock in response to the bit organization information; and
    a data output buffer to receive the data output clock and to output data read from a memory cell to the outside only in response to the data output clock.

2. The synchronous semiconductor device of claim 1, wherein the clock controller comprises a plurality of paths for generating the data output clock from the internal clock, and selects one of the plurality of paths in response to the bit organization information.

3. The synchronous semiconductor device of claim 2, wherein each of the plurality of paths includes a switch that is switched on or off in response to the bit organization information.

4. The synchronous semiconductor device of claim 2, wherein the smaller the bit organization is, the greater a delay time in the selected one of the plurality of paths is.

5. The synchronous semiconductor device of claim 1, wherein the internal clock generator is a delay-locked loop circuit.

6. The synchronous semiconductor device of claim 5, wherein the delay-locked loop circuit comprises:
    a phase comparator to compare the phase of the external clock with the phase of a feedback signal and generate a detection signal corresponding to a difference between their phases;
    a delay controller to receive the detection signal and generate a delay control signal;

a delayer to delay the external clock for a predetermined time in response to the delay control signal and generate the internal clock; and a compensation delayer to delay the internal clock and generating the feedback signal.

7. A synchronous semiconductor device comprising:

a delay-locked loop circuit to receive an external clock and generate a data output clock; and a data output circuit to output data read from a memory cell to the outside only in response to the data output clock, wherein the delay-locked loop circuit comprises:

a phase comparator to compare the phase of external clock with the phase of a feedback signal and generate a detection signal corresponding to a difference between their phases;

a delay controller to receive the detection signal and generating a delay control signal;

a delayer to delay the external clock for a predetermined time in response to the delay control signal and generating the data output clock; and a compensation delay controller to delay the data output clock in response to the bit organization information and generate the feedback signal.

8. The synchronous semiconductor device of claim 7, wherein the compensation delay controller comprises a plurality of paths to generate the feedback signal from the data output clock, and selects one of the plurality of paths in response to the bit organization information.

9. The synchronous semiconductor device of claim 8, wherein each of the plurality of paths comprises a switch that is switched on or off in response to the bit organization information.

10. The synchronous semiconductor device of claim 8, wherein the larger the bit organization is, the greater a delay time in the selected one of the plurality of paths is.

11. A method of regularly adjusting data output time of a synchronous semiconductor device regardless of bit organization, the method comprising:

receiving an external clock and generating an internal clock;

adjusting the phase of the internal clock according to the bit organization and generating a data output clock; and outputting data read from a memory cell to the outside only in response to the data output clock.

12. The method of claim 11, wherein generating the data output clock comprises selecting one of a plurality of paths each having different delay times that generate the data output clock from the internal clock, in response to the bit organization information.

13. A method of regularly adjusting a synchronous semiconductor device regardless of bit organization, the method comprising:

comparing the phase of an external clock with the phase of a feedback signal and generating a detection signal corresponding to a difference between their phases;

generating a delay control signal in response to the detection signal;

delaying the external clock for a predetermined time in response to the delay control signal and generating a data output clock;

adjusting the phase of the data output clock according to the bit organization and generating the feedback signal; and outputting data read from a memory cell to the outside only in response to the data output clock.

14. The method of claim 13, wherein generating the feedback signal comprises selecting one of a plurality of paths each having different delay times that generate the feedback signal from the data output clock, in response to the bit organization information.

15. The synchronous semiconductor device of claim 7, wherein the delayer comprises a series of a number of inverters, wherein the number of inverters determines the predetermined time.

* * * * *

UNITED STATES PATENT AND TRADEMARK OFFICE
CERTIFICATE OF CORRECTION

PATENT NO. : 6,944,089 B2  Page 1 of 2
APPLICATION NO. : 10/334776
DATED : September 13, 2005
INVENTOR(S) : Jeong et al.

It is certified that error appears in the above-identified patent and that said Letters Patent is hereby corrected as shown below:

At column 1, line 14, replace "SCRAM" with --SDRAM--
At column 1, line 16, replace "SCRAM" with --SDRAM--
At column 1, line 19, replace "SCRAM" with --SDRAM--
At column 1, line 21, replace "SCRAM" with --SDRAM--
At column 1, line 22, replace "SCRAM" with --SDRAM--
At column 1, line 24, replace "SCRAM" with --SDRAM--
At column 1, line 26, replace "SCRAM" with --SDRAM--
At column 1, line 28, replace "SCRAM" with --SDRAM--
At column 1, line 32, replace "SCRAM" with --SDRAM--
At column 1, line 36, replace "SCRAM" with --SDRAM--
At column 1, line 37, replace "SCRAM" with --SDRAM--
At column 1, line 39, replace "SCRAM" with --SDRAM--
At column 1, line 40, replace "SCRAM" with --SDRAM--
At column 1, line 48, replace "SCRAM" with --SDRAM--
At column 1, line 49, replace "SCRAM" with --SDRAM--
At column 1, line 52, replace "SCRAM" with --SDRAM--
At column 1, line 55, replace "SCRAM" with --SDRAM--
At column 1, line 56, replace "SCRAM" with --SDRAM--
At column 2, line 2, replace "SCRAM" with --SDRAM--
At column 2, line 6, replace "SCRAM" with --SDRAM--
At column 3, line 45, replace "SCRAM" with --SDRAM--
At column 3, line 46, replace "SCRAM" with --SDRAM--
At column 4, line 15, replace "SCRAM" with --SDRAM--
At column 4, line 16, replace "SCRAM" with --SDRAM--
At column 5, line 18, replace "SCRAM" with --SDRAM--
At column 5, line 24, replace "SCRAM" with --SDRAM--

UNITED STATES PATENT AND TRADEMARK OFFICE
CERTIFICATE OF CORRECTION

PATENT NO.        : 6,944,089 B2
APPLICATION NO. : 10/334776
DATED              : September 13, 2005
INVENTOR(S)       : Jeong et al.

It is certified that error appears in the above-identified patent and that said Letters Patent is hereby corrected as shown below:

At column 5, line 25, replace "SCRAM" with --SDRAM--

Signed and Sealed this

Ninth Day of January, 2007

JON W. DUDAS
*Director of the United States Patent and Trademark Office*